(12) United States Patent
Lee et al.

(10) Patent No.: US 11,152,422 B2
(45) Date of Patent: Oct. 19, 2021

(54) SEMICONDUCTOR DEVICES AND METHODS FOR FORMING THE SAME

(71) Applicant: Vanguard International Semiconductor Corporation, Hsinchu (TW)

(72) Inventors: Hsin-Hui Lee, Kaohsiung (TW); Han-Liang Tseng, Hsinchu (TW); Hsueh-Jung Lin, Jhubei (TW); Chin-Cheng Li, Huatan Township (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 110 days.

(21) Appl. No.: 16/661,531

(22) Filed: Oct. 23, 2019

(65) Prior Publication Data
US 2021/0126039 A1    Apr. 29, 2021

(51) Int. Cl.
*H01L 27/146* (2006.01)

(52) U.S. Cl.
CPC .... *H01L 27/14687* (2013.01); *H01L 27/1462* (2013.01); *H01L 27/14623* (2013.01); *H01L 27/14632* (2013.01); *H01L 27/14685* (2013.01); *H01L 27/14698* (2013.01)

(58) Field of Classification Search
None
See application file for complete search history.

(56) References Cited

U.S. PATENT DOCUMENTS

| | | | |
|---|---|---|---|
| 10,651,218 B1* | 5/2020 | Lee | H01L 27/14625 |
| 10,935,805 B2* | 3/2021 | Lee | G02B 3/0056 |
| 2018/0040675 A1 | 2/2018 | Zeng et al. | |
| 2020/0210669 A1* | 7/2020 | Lee | G06K 9/0004 |
| 2021/0033918 A1* | 2/2021 | Zhang | G02F 1/13394 |

OTHER PUBLICATIONS

Taiwanese Office Action and Search Report, dated Feb. 27, 2020, for Taiwanese Application No. 108131593.

* cited by examiner

*Primary Examiner* — Michelle Mandala
(74) *Attorney, Agent, or Firm* — Birch, Stewart, Kolasch & Birch, LLP

(57) ABSTRACT

A method for forming a semiconductor device is provided. The method includes providing a substrate having a scribe line, forming a sensing pixel array in the substrate, forming a plurality of transparent pillars over the substrate, and forming a light shielding layer over the substrate and the transparent pillars. The sensing pixel array has a plurality of sensing pixels, and each of the transparent pillars is correspondingly disposed on one of the sensing pixels of the sensing pixel array. The method further includes performing a first cutting process to form an opening directly above the scribe line, while leaving the remaining material covering the scribe line, and performing an etching process along the opening to remove the remaining material until the scribe line is exposed.

15 Claims, 8 Drawing Sheets

SEMICONDUCTOR DEVICES AND METHODS FOR FORMING THE SAME

BACKGROUND

Technical Field

The disclosure relates to semiconductor devices, and more particularly to optical sensing structures and methods for forming the same.

Description of the Related Art

Today's mobile devices (such as cell phones, tablet computers, and laptop computers) are equipped with a user recognition system to provide access control for personal information security. Each person has unique fingerprint. Therefore, fingerprint sensors are a common and reliable recognition system for users.

Most commercially available fingerprint sensors used to recognize the fingerprints of users are based on optical sensing technologies. An optical sensor used as a fingerprint recognition device may be formed of a large number of optical elements, and it may include a light collimator, a beam splitter, a focus lens, and a linear sensor. The function of the light collimator is to collimate light to reduce power loss caused by light divergence.

Although existing optical sensors have been generally adequate for their intended purposes, they have not been entirely satisfactory in all respects. In particular, increasing the yield of production and reliability of products still needs further improvement.

SUMMARY

Some embodiments of the present disclosure provide a method for forming semiconductor devices. The method includes providing a substrate having a scribe line, and forming a sensing pixel array in the substrate. The sensing pixel array includes a plurality of sensing pixels. The method also includes forming a plurality of transparent pillars over the substrate, and forming a light shielding layer over the substrate and over the transparent pillars. Each of the transparent pillars is disposed on a corresponding sensing pixel in the sensing pixel array. The method further includes performing a first cutting process to form an opening directly above the scribe line, and leaving the remaining material covering the scribe line. The method also includes performing an etching process along the opening to remove the remaining material until the scribe line is exposed.

Some embodiments of the present disclosure provide a semiconductor device. A semiconductor device includes a sensing pixel array in a substrate, and a plurality of transparent pillars over the substrate. The sensing pixel array includes a plurality of sensing pixels. Each of the transparent pillars is disposed on a corresponding sensing pixel in the sensing pixel array. The semiconductor device also includes a light shielding layer over the substrate and between the transparent pillars. A sidewall of the light shielding layer and an edge of the substrate together form a stepped profile.

A detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn in scale, wherein.

DETAILED DESCRIPTION

Figure 1A:
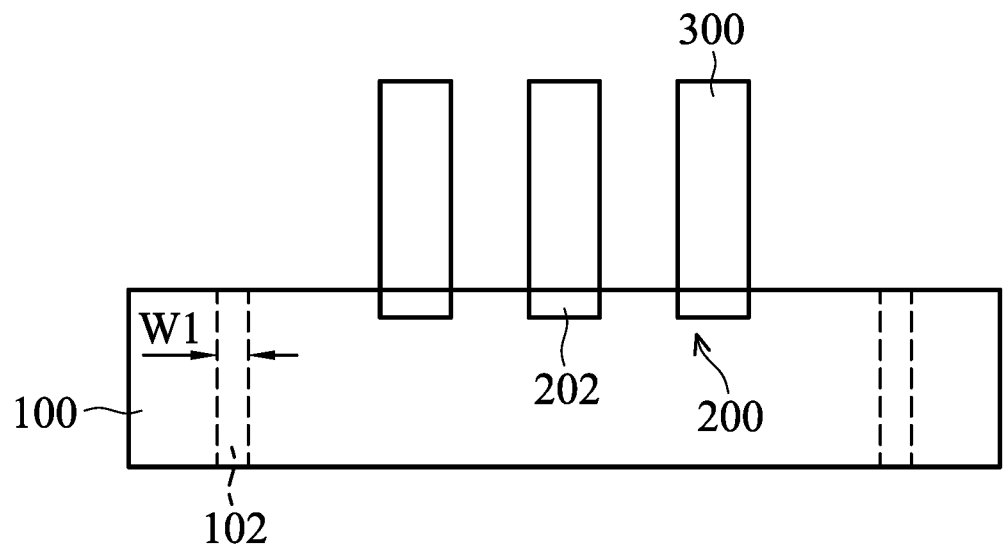
FIG. 1A to FIG. 1F are cross-sectional views illustrating intermediate stages of an exemplary method for forming the semiconductor device 10 of FIG. 1F in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The terms "about", "approximately", and "substantially" used herein generally refer to a value of an error or a range within 40 percent, preferably within 20 percent, and more preferably within 10 percent, within 5 percent, within 3 percent, within 2 percent, or within 1 percent. If there is no specific description, the mentioned values are regarded as an approximation that is the error or the range expressed as "about", "approximate", or "substantially".

Some variations of the example methods and structures are described. Persons having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

Embodiments of semiconductor device and methods for forming the same especially suited for an optical sensor having a light collimating layer are provided. In some embodiments of the present disclosure, a cutting process and an etching process are performed to remove other materials above the scribe line before wafer dicing to separate die from the wafer, thereby reducing defects caused by wafer dicing. As a result, the delamination at the corners or edges of a die that typically occurs in subsequent reliability tests can be eliminated.

Figure 1B:
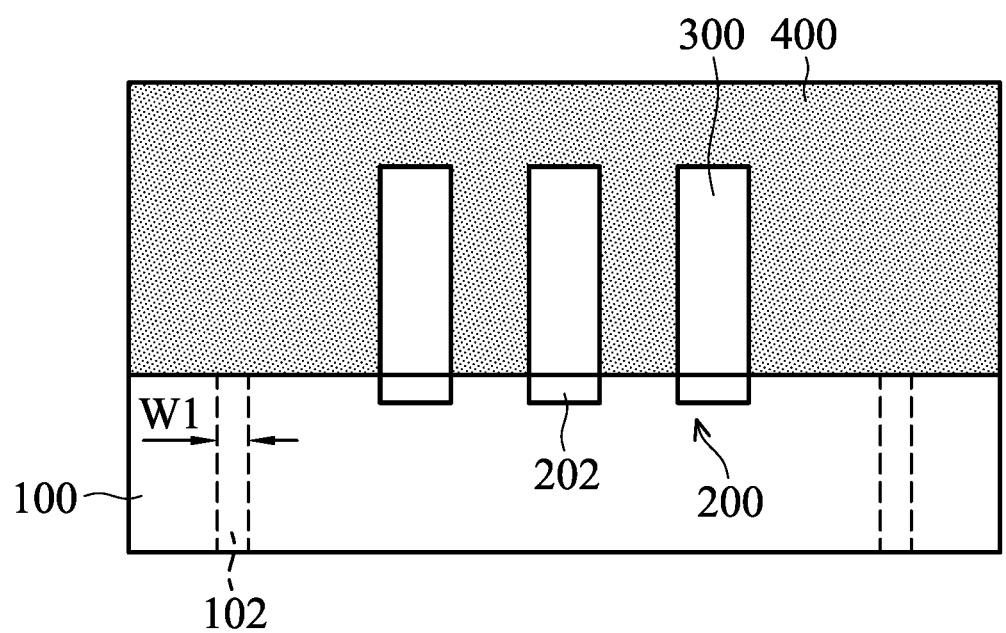
Figure 1C:
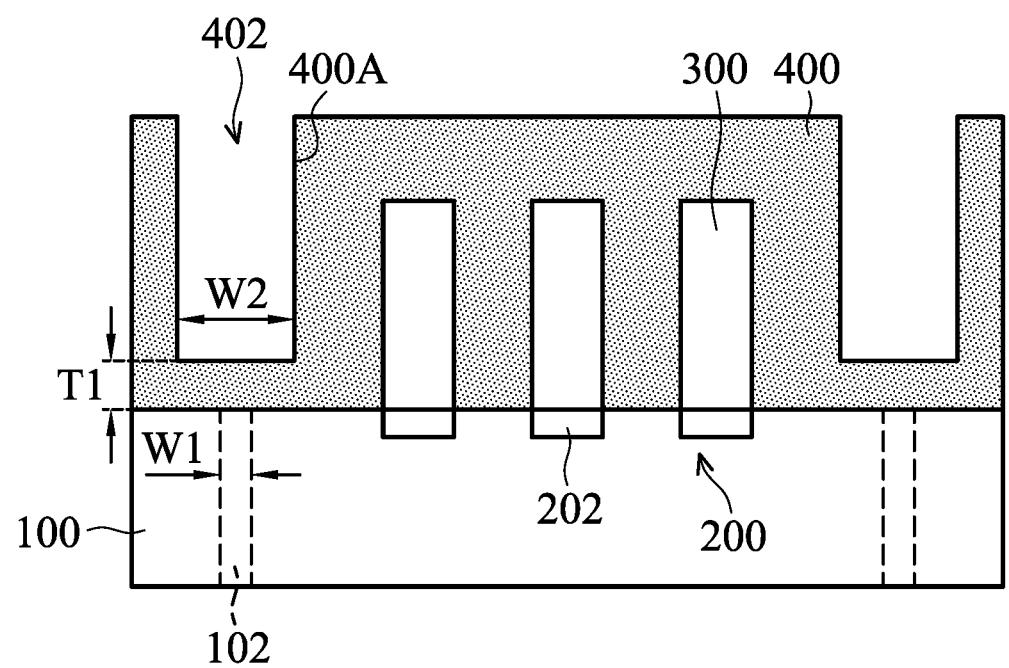
Figure 1D:
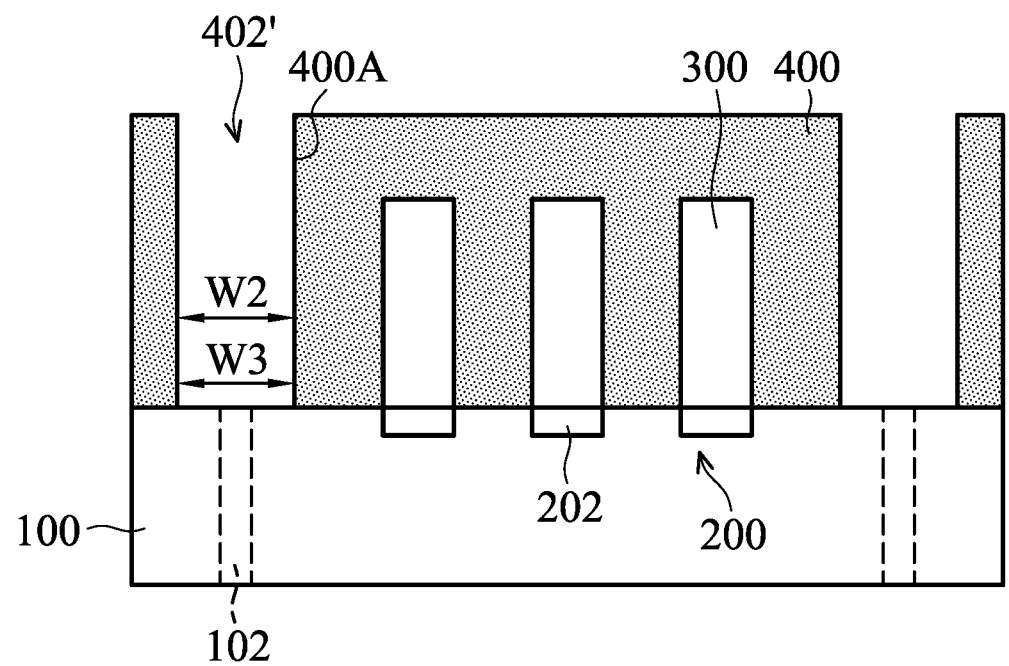
Figure 1E:
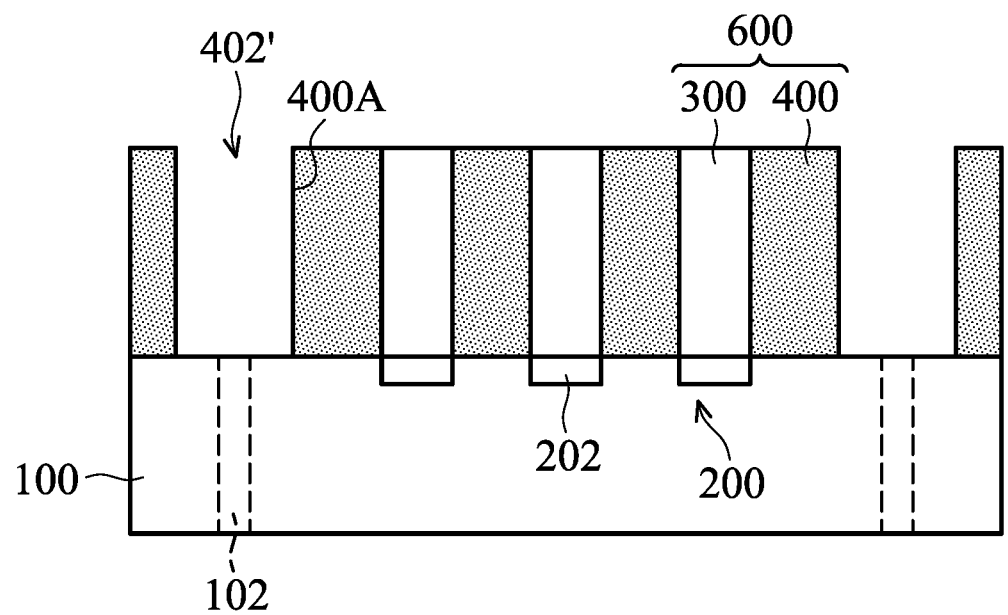
Figure 1F:
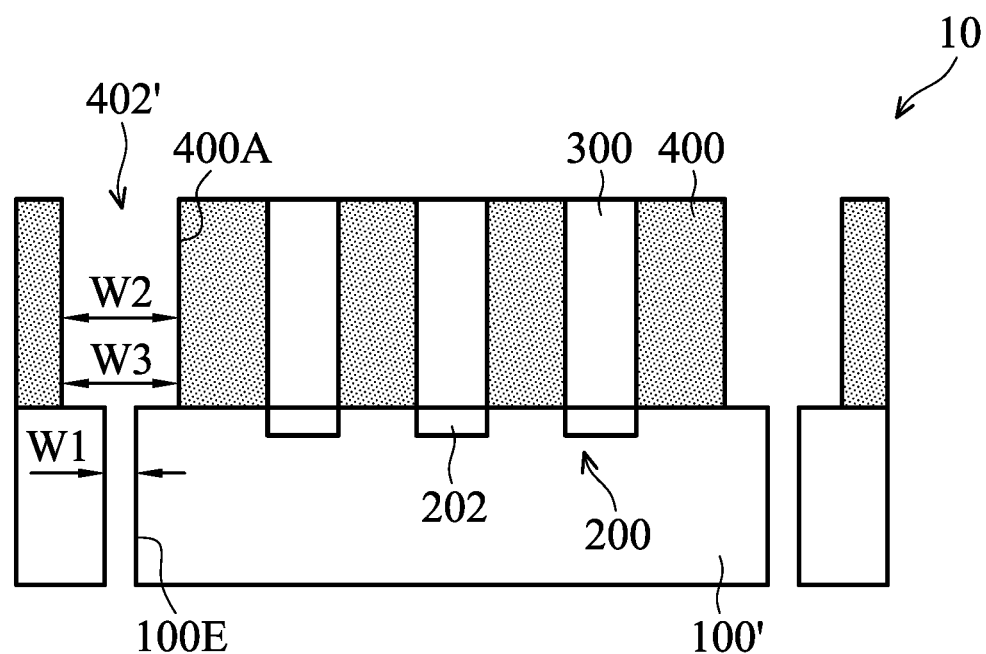

FIG. 1A to FIG. 1F are cross-sectional views illustrating intermediate stages of an exemplary method for forming the semiconductor device 10 of FIG. 1F in accordance with some embodiments.

FIG. 1A illustrates an initial step of a method for forming the semiconductor device 10 according to an embodiment of the present disclosure. As shown in FIG. 1A, a substrate 100 having a scribe line 102 is provided. In one embodiment, the substrate 100 may be a silicon substrate, a silicon germanium (SiGe) substrate, a compound semiconductor substrate, a bulk semiconductor substrate, a semiconductor-on-insulator (SOI) substrate, or the like, which may be doped (e.g., with a p-type or an n-type dopant) or undoped. Generally, an SOI substrate includes a layer of a semiconductor material formed on an insulator layer. The insulator layer may be, for example, a buried oxide layer (BOX), a silicon oxide layer, or the like. The insulator layer is generally provided on a silicon substrate or a glass substrate. Other substrates, such as a multi-layered or gradient substrate may also be used. In some embodiments, the semiconductor material of the semiconductor substrate may include elementary semiconductors including silicon (Si) or germanium (Ge); compound semiconductors including silicon carbide (SiC), gallium arsenide (GaAs), gallium phosphide (GaP), indium phosphide (InP), indium arsenide (InAs), or indium antimonide (InSb); alloy semiconductors including SiGe alloy, GaAsP alloy, AlInAs alloy, AlGaAs alloy, GaInAs alloy, GaInP alloy, or GaInAsP alloy; or a combination thereof.

In some embodiments, the substrate 100 may include various isolation features (not shown) which are used to define active regions in/on the substrate 100 and to isolate the active regions. In some embodiments, the isolation features may include shallow trench isolation (STI) features, local oxidation of silicon (LOCOS) features, other suitable isolation features, or a combination thereof.

In some embodiments, the substrate 100 may include various features of the semiconductor device, and those features may include transistors, diodes, other suitable features, or a combination thereof. For example, the transistors may include metal oxide semiconductor field effect transistor (MOSFET), complementary metal oxide semiconductor (CMOS), bipolar junction transistors (BJT), high-voltage transistors, high-frequency transistors, p-channel and/or n-channel field effect transistors (PFETs/NFETs), etc.

In some embodiments, the substrate 100 may include various conductive features, such as conductive lines or conductive vias (not shown). For example, the above conductive features may be made of aluminum (Al), copper (Cu), tungsten (W), other suitable conductive materials, an alloy thereof, or a combination thereof.

As shown in FIG. 1A, the scribe lines 102 are depicted in dashed lines. In the subsequent process, the wafer dicing is performed along the scribe lines 102 to cut the wafer into individual dies. In some embodiments, a width W1 of the scribe line 102 is in a range between about 25 µm and about 500 µm. In some embodiments, the width W1 of the scribe line 102 is in a range between about 50 µm and about 150 µm, such as about 80 m.

As shown in FIG. 1A, a sensing pixel array 200 is formed in the substrate 100, and the sensing pixel array 200 comprises several sensing pixels 202, in accordance with some embodiments. The sensing pixels 202 are electrically connected to a signal process circuitry (not shown). In some embodiments, the number of sensing pixels 202 of the sensing pixel array 200 is determined based on the size of the optical sensing area. Each of the sensing pixels 202 may include one or more photodetectors. In some embodiments, a photodetector may include photodiodes. A photodiode may include P-type semiconductor layer, an intrinsic layer, and a photoelectric material structure of tri-layered N-type semiconductor layers. Light absorbed in the intrinsic layer generates excitons, and the excitons are divided into electrons and holes at the interface between the P-type semiconductor layer and the N-type semiconductor layers, thereby generating electronic signal. In some other embodiments, the photodetector may also include charged coupling device (CCD) sensors, complimentary metal-oxide-semiconductor (CMOS) image sensors, active sensors, passive sensors, other suitable sensors, or a combination thereof. In some embodiments, the sensing pixels 202 convert the optical signals as received into an electronic signal by the photodetector, and the electronic signal is processed by the signal process circuitry. It should be noted that the number and arrangement of the sensing pixels 202 of the sensing pixel array 200 shown in FIG. 1A are provided merely for illustration. The actual number and arrangement of the sensing pixels 202 are not limited thereto. According to the embodiments of the disclosure, the sensing pixels 202 can be in an array with any number of rows and columns, or in another arrangement.

Also referring to FIG. 1A, several transparent pillars 300 are formed over the sensing pixel array 200. Each of the transparent pillars 300 is correspondingly disposed on one of the sensing pixels 202. In some embodiments, a transparent material layer (not shown) is blanketly formed on the substrate 100 to cover the sensing pixel array 200. In some embodiments, the transparent material layer may include a transparent material having a transmittance greater than about 90% for light having a wavelength between 300 nm and 1200 nm, thereby allowing a portion of the incident light to pass through the transparent material layer and reach the sensing pixels 202.

In some embodiments, the transparent material layer may include a photocuring material, a UV-curable material, a thermosetting material, or a combination thereof. For example, the transparent material layer may include poly (methyl methacrylate)(PMMA), polyethylene terephthalate (PET), polyethylene naphthalate (PEN), polycarbonate (PC), perfluorocyclobutyl (PFCB) polymer, polyimide (PI), acrylic resin, epoxy resins, polypropylene (PP), polyethylene (PE), polystyrene (PS), polyvinyl chloride (PVC), another suitable material, or a combination thereof. In some embodiments, the transparent material layer may be deposited on the substrate 100 by spin coating, casting, bar coating, blade coating, roller casting, wire bar coating, dip coating, chemical vapor deposition (CVD), another suitable method, or a combination thereof. In some embodiments, the thickness of the transparent material layer formed using the aforementioned methods is in a range between about 10 µm and about 300 µm, such as about 100 µm. In some other embodiments, the thickness of the transparent material layer is in a range between about 100 μm and about 500 μm, such as about 300 μm.

Next, the transparent material layer on the substrate 100 is selectively removed to form transparent pillars 300, as shown in FIG. 1A. In some embodiments, since the transparent pillars 300 are disposed on the sensing pixels 202 correspondingly, the transparent pillars 300 can protect the sensing pixels 202 and prevent the sensing pixels 202 from contamination and/or damage in the processes, thereby maintaining or improving the sensitivity of the semiconductor device 10. In some embodiments, each of the transparent pillars 300 is correspondingly disposed on one of the sensing pixels 202, as shown in FIG. 1A. In some other embodiments, at least one of the transparent pillars 300 covers two or more of the sensing pixels 202 (not shown). In some embodiments, in the top view, the transparent pillars 300 may have circular shape, rectangular shape, polygonal shape, any shape or a combination thereof, and can be arranged as an array (not shown).

In some embodiments, the transparent material layer may be selectively removed by a patterning process to form the transparent pillars 300. In some embodiments, the patterning process includes a photolithography process and an etching process if the transparent material layer is a non-photoresist material. In some embodiments, the photolithography process may include photoresist coating (e.g., spin-on coating), soft baking, pattern exposure, post-exposure baking, development, rinsing and drying (e.g., hard baking), other suitable techniques, or a combination thereof. The etching process may include a wet etching process, a dry etching process (e.g., reactive ion etch (RIE), plasma etching, or ion milling), other suitable processes, or a combination thereof.

In some other embodiments where the transparent material layer is a photoresist material, the transparent pillars 300 may be directly formed by patterning the transparent material layer using a photolithography process without additional etching process. This photolithography process mentioned herein is similar to the photolithography process mentioned above, and the details are not repeated herein.

In some embodiments, the transparent pillars 300 formed by aforementioned methods have a thickness in a range between about 5 μm and about 500 μm, such as about 100 μm. In some other embodiments, the thickness of the transparent pillars 300 is, for example, about 60 μm. In some embodiments, top surfaces of the transparent pillars 300 are substantially leveled with each other. In some embodiments, the ratio of height to width (i.e. aspect ratio) of the transparent pillars 300 is in a range between about 2 and about 30, such as about 5, about 10, about 15 or about 20. If the transparent pillars 300 are too high (i.e. the aspect ratio is too large), the transparent pillars 300 tend to deform or collapse, which leads to an increase in process difficulty and production cost. If the transparent pillar 300 is too wide (i.e. the aspect ratio is too small), it is easy to receive unnecessary incident light and difficult to achieve the collimating effect, thereby reducing the sensitivity of the semiconductor device 10.

Next, as shown in FIG. 1B, a light-shielding layer 400 is formed on the substrate 100, and fills spaces between the transparent pillars 300. In some embodiments, the light-shielding layer 400 may include a material having a lower transmittance than about 1% for light having a wavelength of 300 nm to 1200 nm, thereby leading the light to reach the corresponding sensing pixels 202 accurately. In the subsequent processes, the transparent pillars 300 on the sensing pixels 202 and the light-shielding layer 400 between the transparent pillars 300 together form a light collimating layer 600 (details will be described later).

In some embodiments, the light-shielding layer 400 may include a nontransparent photoresist (such as a black photoresist or other suitable opaque photoresists), an ink (such as a black ink or other suitable opaque inks), a molding compound (such as a black molding compound or other suitable opaque molding compounds), a solder mask (such as a black solder mask or other suitable opaque solder masks), another suitable material, or a combination thereof.

In some embodiments, the light-shielding layer 400 may include photocuring material, thermal curing material, or a combination thereof. In some embodiments, a light-shielding material may be coated or dispensed on the substrate 100. Therefore, the light-shielding material fully covers the transparent pillars 300 and fills spaces between the transparent pillars 300. Then, the light-shielding material is cured by performing a curing process thereby forming the light-shielding layer 400. For example, the curing process may include a photocuring process, a thermal curing process, or a combination thereof.

FIG. 1C illustrates the formation of an opening 402. In some embodiments, a cutting process is performed on the light-shielding layer 400 to remove the main portion of the light-shielding layer 400 above the scribe line 102, thereby forming an opening 402 above the scribe line 102, and leaving a portion of the light-shielding layer 400 covering the scribe line 102. The remaining portion of the light-shielding layer 400 can protect the substrate 100 and prevent the substrate 100 from damages during the cutting process.

Sidewalls 400A of the light-shielding layer 400 are generated due to the formation of the opening 402. In some embodiments, the bottom of the opening 402 has a width W2, and the width W2 is in a range between about 25 μm and about 600 μm. In some embodiments, the width W2 of the opening 402 is in a range between about 20 μm and about 500 μm, such as 80 μm. In some embodiments, the width W2 of the opening 402 is greater than the width W1 of the scribe line 102.

Although the opening 402 in FIG. 1C has substantially vertical sidewalls and a substantially flat bottom surface, the disclosure is not limited thereto. For example, the opening 402 may have slanted sidewalls, a concave bottom surface, or another profile for the sidewalls and the bottom surface. In some embodiments, the cutting process may be a laser cutting process, an ion beam cutting process, a wire sawing process, a die sawing process, another suitable cutting process, or a combination thereof.

Next, as shown in FIG. 1D, an etching process is performed along the opening 402 to remove the remaining material of the light-shielding layer 400 above the scribe line 102 until the scribe line 102 is exposed. Thus, the opening 402 is extended to form an opening 402'. The remaining material of the light-shielding layer 400 above the scribe line 102 can be completely removed by the etching process without damaging the surface of the substrate 100.

Since the scribe line 102 is not covered by any structure or layer (such as the light-shielding layer 400), the cutting process is only performed on the substrate 100 during the cutting process for obtaining individual dies from the wafer. No structure or layer is cut during the cutting process, except for the substrate 100. Therefore, the risk of causing microcracks in the material layers and the risk of peeling due to poor adhesion between the substrate 100 and another structure or layer during the cutting process can be reduced. As a result, the delamination at the corners or edges of a die that typically happens during subsequent reliability tests can be eliminated.

In some embodiments, the sidewalls 400A are extended from the substrate 100 due to the formation of the opening 402'. In some embodiments, the bottom of the opening 402' has a width W3, and the width W3 is in a range between about 20 μm and about 600 μm. In some embodiments, a width W3 of the bottom of the opening 402' is in a range between about 25 μm and about 200 μm, such as about 90 μm. In some embodiments, the width W3 of the opening 402' is greater than the width W1 of the scribe line 102. In some embodiments, the width W3 of the opening 402' is equal to the width W2 of the opening 402. Although the opening 402' in FIG. 1D has substantially vertical sidewalls, the disclosure is not limited thereto. For example, the opening 402' may have slanted sidewalls or other shapes of sidewalls.

In some embodiments, the etching process may include a dry etching process, a wet etching process, other suitable process, or a combination thereof. For example, the dry etching process may include reactive ion etch (RIE), inductive couple plasma (ICP) etching, neutral beam etching (NBE), electron cyclotron resonance (ECR), other suitable process, or a combination thereof. For example, the etchant used in the wet etching process may include hydrofluoric acid (HF), ammonium hydroxide ($NH_4OH$), any suitable etchant, or a combination thereof. In some embodiments, the light-shielding layer 400 may include epoxy or another applicable material, which can be patterned by a dry etching process or another applicable etching process.

Compared to some methods of the embodiments that merely include a cutting process, an etching process that removes the material right above the scribe line 102 will not cause damage to the substrate 100, in accordance with some embodiments. The methods that merely include a cutting process in some embodiments may leave material on the scribe line 102. Since the substrate 100 is not damaged in the etching process, the material that remains on the scribe line 102 can be completely removed by the etching process, thereby improving the reliability of the semiconductor device 10.

According to the embodiments described above, the cutting process and the etching process are performed on the light shielding layer 400 directly above the scribe line 102. The main portion of the light shielding layer 400 directly above the scribe line 102 can be quickly removed by the cutting process, and the remaining portion of the light shielding layer 400 directly above the scribe line 102 can be completely removed by the etching process to expose the scribe line 102. The remaining portion of the light shielding layer 400 can protect the substrate 100 from damage during the cutting process. The etching process is applied to clean the remaining portion of the light shielding layer 400 on the scribe line 102 without damaging the surface of the substrate 100. In some embodiments, the thickness T1 of the remaining portion of the light shielding layer 400 is in a range between about 5 μm and about 100 μm. In some embodiments, the thickness T1 of the remaining portion of the light shielding layer 400 is in a range between about 10 μm and about 40 μm; for example, the thickness T1 is in a range between about 20 μm and about 25 μm. When the thickness T1 is in the aforementioned range, the remaining portion of the light shielding layer 400 has a sufficient thickness to effectively protect the substrate 100 during the cutting process. Also, the etching process will not take too much time to remove the remaining portion, since the remaining portion is not too thick. In some embodiments, the ratio of the thickness of the portion removed by the cutting process to the thickness of the portion removed by the etching process is in a range between 20 to 1 (20:1) and 2 to 1 (2:1).

Next, as shown in FIG. 1E, in some embodiments, a planarization process (such as CMP process, a grinding process, another suitable process, or a combination thereof) is performed to remove the top portion of the light shielding layer 400. As a result, the top surface of the light shielding layer 400 is leveled with the top surfaces of the transparent pillars 300. As mentioned above, the transparent pillars 300 on the sensing pixels 202 and the light-shielding layer 400 between the transparent pillars 300 together form a light collimating layer 600. The function of the light collimating layer 600 is to collimate light and reduce power loss caused by light divergence. In some embodiments, other optical elements, such as color filters, glass, or microlenses (not shown), may be disposed on the light collimating layer. In some embodiments, the incident light passes through the optical elements above the light collimating layer 600 and through the light collimating layer 600 to illuminate the sensing pixels 202.

In some embodiments, a hard cover (not shown) can be disposed above the light collimating layer 600. The hard cover may include a rigid transparent material, such as calcium aluminosilicate glass, soda lime glass, sapphire, transparent polymer, or another suitable material, thereby allowing penetration of at least parts of the incident light and light illumination at the sensing pixels 202. Also, the hard cover can protect the semiconductor device 10 and other elements under the hard cover.

As shown in FIG. 1F, another cutting process is performed to cut the substrate 100 along the scribe line 102, thereby forming the semiconductor device 10. Since each of the width W2 of the opening 402 and the width W3 of the opening 402' is greater than the width W1 of the scribe line 102, the cutting process is only performed on the substrate 100, without touching any other structure or layer (such as the light-shielding layer 400). Therefore, the risk of causing micro-cracks in the material layers and the risk of peeling due to poor adhesion between the substrate 100 and another structure or layer during the cutting process can be reduced. Accordingly, the delamination at the corners or edges of a die that typically happens during subsequent reliability tests can be eliminated.

In some embodiments, a substrate 100' is formed after the cutting process is performed on the substrate 100. The sidewall 400A of the light shielding layer 400 and an edge 100E of the substrate 100' together form a stepped profile, as shown in FIG. 1F. In some embodiments, the distance between the sidewall 400A of the light shielding layer 400 and the edge 100E of the substrate 100' is in a range from greater than 0 μm to about 600 μm. In some embodiments, the distance between the sidewall 400A of the light shielding layer 400 and the edge 100E of the substrate 100' is in a range of about 1 m to about 500 μm, such as about 10 μm.

In some embodiments, the cutting process performed on the substrate 100 may be a laser cutting process, an ion beam cutting process, a wire sawing process, a die sawing process, another suitable cutting process, or a combination thereof.

According to the aforementioned embodiments, the cutting process and the etching process are performed on a portion of the light-shielding layer above the scribe line, thereby removing the material covering the scribe line without damaging the surface of the substrate. Since the scribe line is not covered by any structure (such as the light-shielding layer), the cutting process is only performed on the substrate during the cutting process for obtaining individual dies from the wafer. No structure or layer is cut during the cutting process, except for the substrate. Therefore, the risk of causing micro-cracks in the material layers and the risk of peeling due to poor adhesion between the substrate 100 and another structure or layer during the cutting process can be reduced. Accordingly, the delamination at the corners or edges of the die that typically happens in subsequent reliability tests can be eliminated.

Figure 2A:
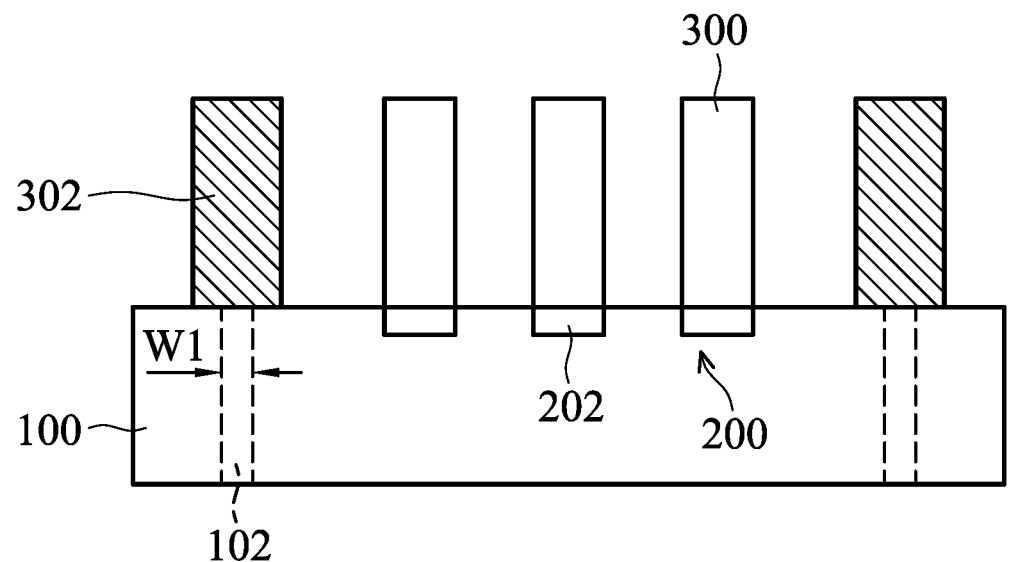
FIG. 2A to FIG. 2F are cross-sectional views illustrating intermediate stages of another exemplary method for forming the semiconductor device 20 of FIG. 2F in accordance with some embodiments.
Figure 2B:
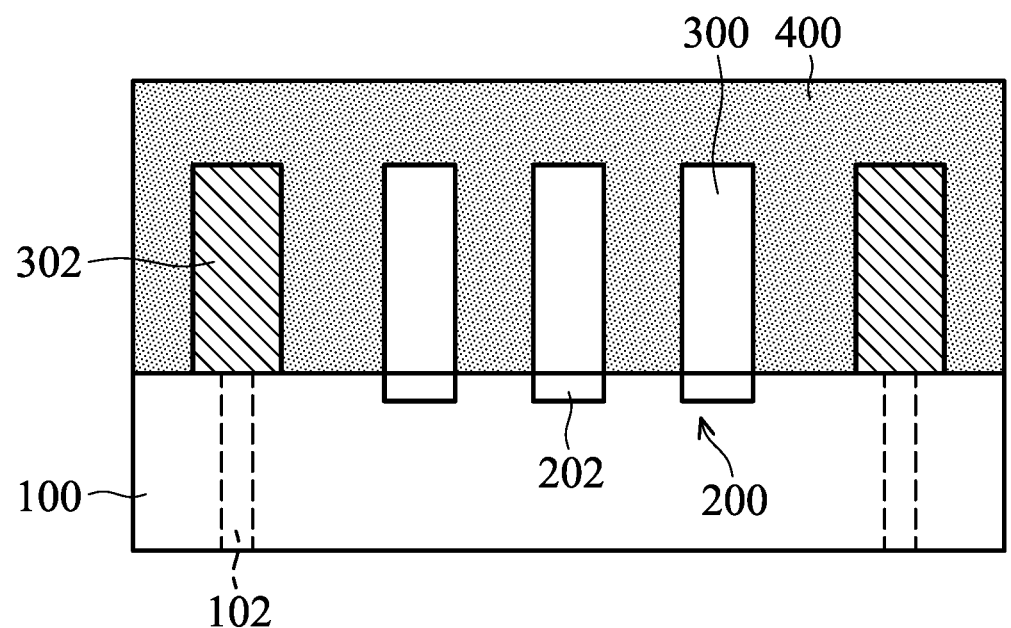
Figure 2C:
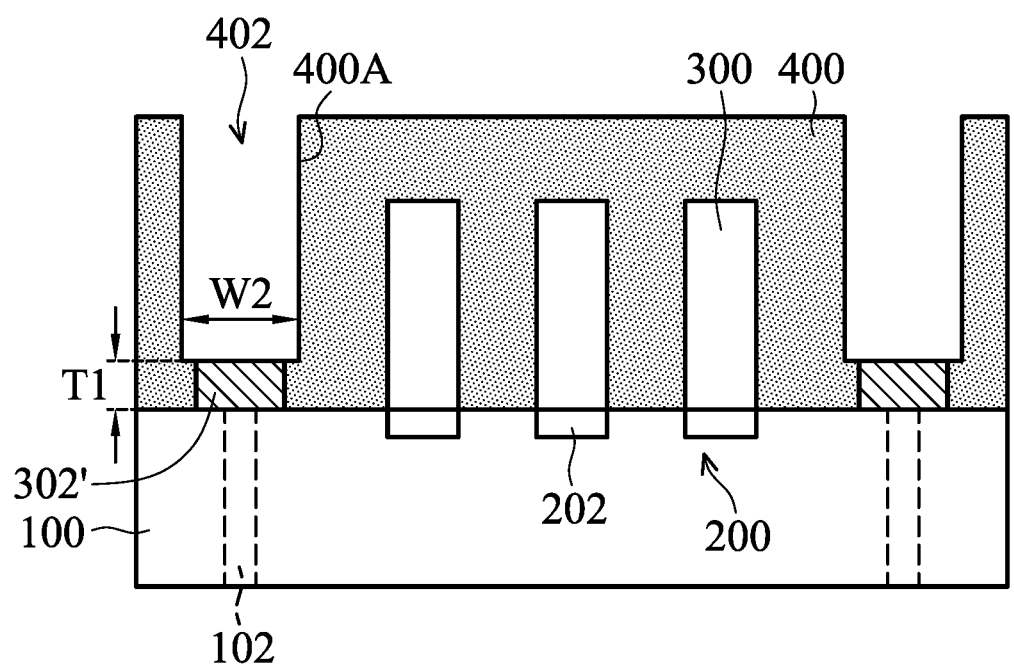
Figure 2D:
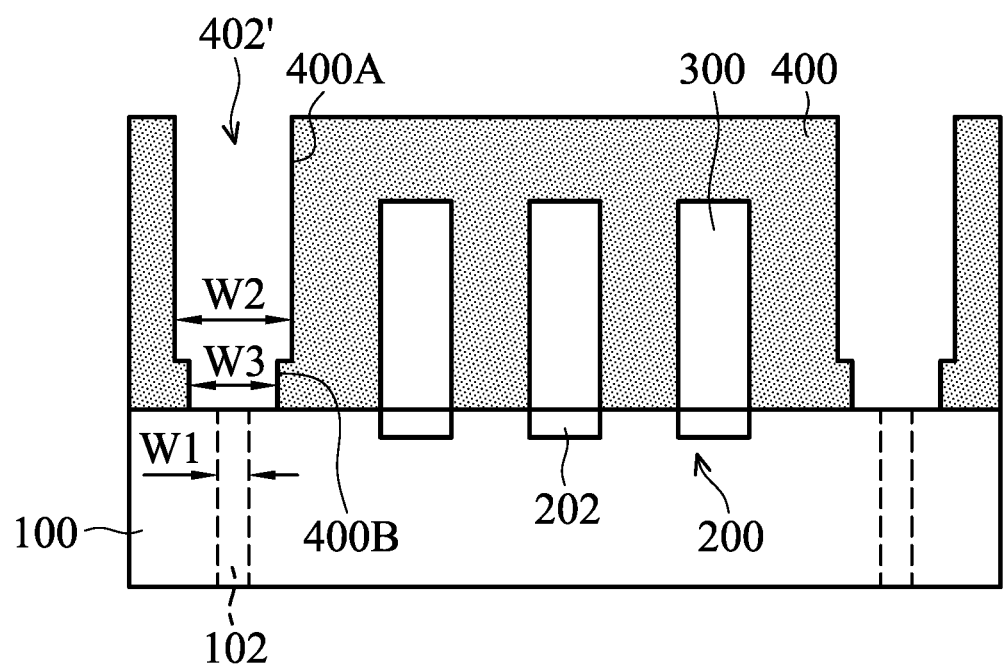
Figure 2E:
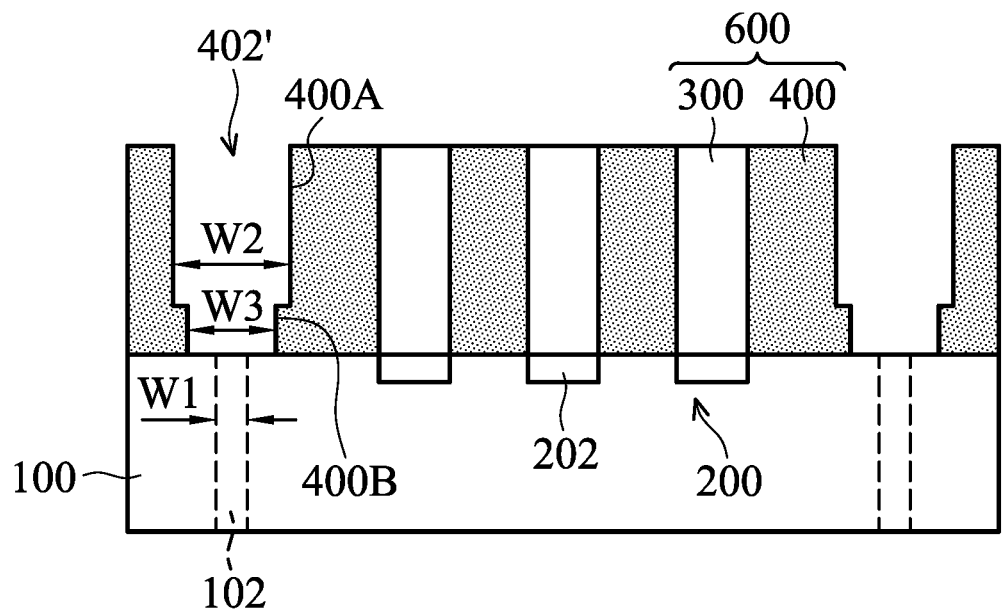
Figure 2F:
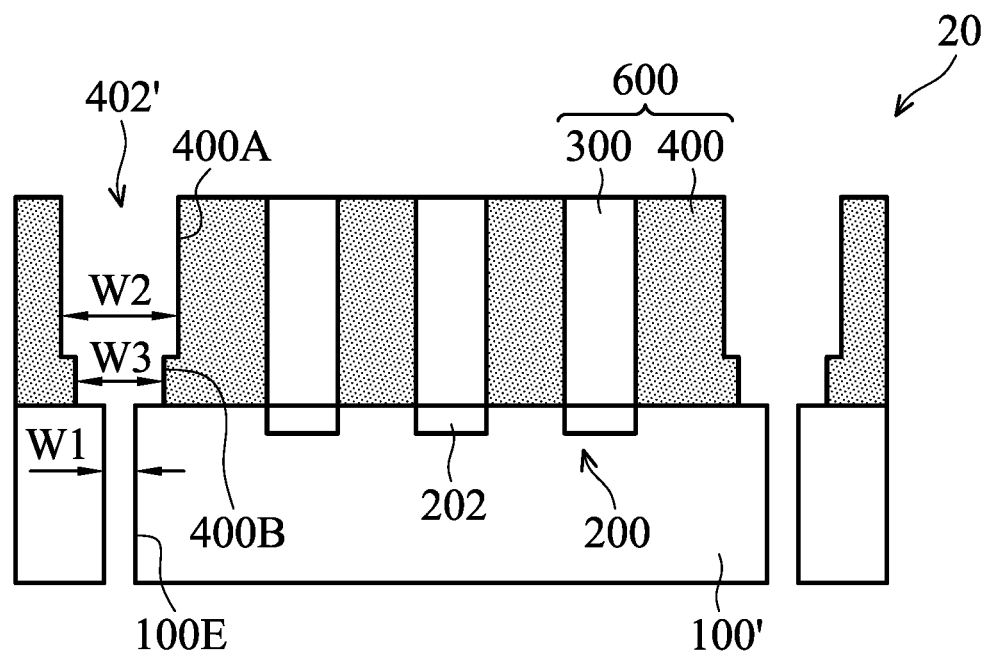

FIG. 2A to FIG. 2F are cross-sectional views illustrating intermediate stages of another exemplary method for forming the semiconductor device 20 of FIG. 2F in accordance with some embodiments. For the sake of clarity, elements and processes that are the same or similar will be given the same reference numbers. For the purpose of brevity, the descriptions of these processes and devices are not repeated herein.

In the embodiments shown in FIG. 2A to FIG. 2F, the method for forming the semiconductor device 20 is similar to the method for forming the semiconductor device 10, except that a sacrificial structure 302 is formed above the scribe line 102 before forming the light shielding layer 400.

As shown in FIG. 2A, a sacrificial structure 302 is formed directly above the scribe line 102 before forming the light shielding layer 400. Also, the sacrificial structure 302 covers the scribe line 102. In this embodiment, the sacrificial structure 302 is formed of a material that is easier to remove (by, for example, an etching process), and the processing time can be shortened. In some embodiments, the width of the sacrificial structure 302 is in a range between about 25 μm and about 500 μm, such as about 100 μm. In some embodiments, the width of the sacrificial structure 302 is greater than the width W1 of the scribe line 102, as shown in FIG. 2A.

In some embodiments, the process and the material for forming the sacrificial structure 302 can be similar to the process and the material for forming the transparent pillars 300. Also, the sacrificial structure 302 and the transparent pillars 300 can be formed in the same step. However, the disclosure is not limited thereto. In other embodiments, the process and/or the material for forming the sacrificial structure 302 can be different from the process and/or the material for forming the transparent pillars 300. Also, the sacrificial structure 302 can be formed before, during or after formation of the transparent pillars 300. For example, in this embodiment, the sacrificial structure 302 includes a photoresist material, and the transparent pillars 300 are formed of transparent resin. In some embodiments, the sacrificial structure 302 and the transparent pillars 300 may have different heights.

As shown in FIG. 2B, a light-shielding layer 400 is formed on the substrate 100 and fills spaces between the transparent pillars 300 and the sacrificial structure 302. In some embodiments, the process and material for forming the light-shielding layer 400 in FIG. 2B can be similar to the process and material for forming the light-shielding layer 400 in FIG. 1B as described above, and the details are not repeated herein.

FIG. 2C illustrates the formation of an opening 402. In some embodiments, a cutting process is performed on the light shielding layer 400 and the sacrificial structure 302 to remove a portion of the light shielding layer 400 and a portion of the sacrificial structure 302 directly above the scribe line 102, thereby forming an opening 402 above the scribe line 102. Also, the scribe line 102 is covered by the remaining sacrificial structure 302', as shown in FIG. 2C. The remaining sacrificial structure 302' can protect the substrate 100 from being damaged during the cutting process. In some embodiments, the thickness T1 of the remaining sacrificial structure 302' is in a range between about 1 m and about 500 μm. In some embodiments, the thickness T1 of the remaining sacrificial structure 302' is in a range between about 5 μm and about 100 μm, such as about 20 μm. When the thickness T1 is in the aforementioned range, the remaining sacrificial structure 302' can effectively protect the substrate 100 during the cutting process. Also, the etching process will not take too much time to remove the remaining sacrificial structure 302' since the remaining portion is not too thick.

In addition, the sacrificial structure 302 and the light shielding layer 400 may be formed of materials with different etching selectivity. As a result, the light shielding layer 400 is not etched substantially during etching the remaining sacrificial structure 302', thereby forming the light shielding layer 400 having sidewalls with a desired profile after an etching process is performed subsequently. Moreover, compared to the material of the light shielding layer 400, the sacrificial structure 302 may include a material that is easier to etch, thereby shortening the time required for performing the etching process.

In some other embodiments, the cutting process for forming the opening 402 merely removes a portion of the light shielding layer 400 above the scribe line 102, and does not remove the sacrificial structure 302 (not shown). In those embodiments, the opening 402 exposes the top surface of the sacrificial structure 302.

Upper sidewalls 400A of the light-shielding layer 400 are generated due to the formation of the opening 402. In some embodiments, the bottom of the opening 402 has a width W2, and the width W2 is in a range between about 25 μm and about 600 μm. In some embodiments, the width W2 of the opening 402 is in a range between about 20 μm and about 500 μm, such as 80 μm. In some embodiments, the width W2 of the opening 402 is greater than the width W1 of the scribe line 102. In this embodiment, the width W2 of the opening 402 is greater than the width of the sacrificial structure 302, so that the top surface of the remaining sacrificial structure 302' is fully exposed by the opening 402.

Although the opening 402 in FIG. 2C has substantially vertical sidewalls and a substantially flat bottom surface, the disclosure is not limited thereto. For example, the opening 402 may have slanted sidewalls, a concave bottom surface, or another profile for the sidewalls and the bottom surface. In some embodiments, the cutting process may be a laser cutting process, an ion beam cutting process, a wire sawing process, a die sawing process, another suitable cutting process, or a combination thereof.

Next, as shown in FIG. 2D, an etching process is performed along the opening 402 to remove the remaining sacrificial structure 302' above the scribe line 102 until the scribe line 102 is exposed. Thus, the opening 402 is extended to form an opening 402'. The remaining sacrificial structure 302' above the scribe line 102 can be completely removed by the etching process without damaging the surface of the substrate 100.

In some embodiments, the bottom of the opening 402' has a width W3, and the width W3 is in a range between about 20 μm and about 600 μm. In some embodiments, a width W3 of the bottom of the opening 402' is in a range between about 25 μm and about 200 μm, such as about 90 μm. In some embodiments, the width W3 of the opening 402' is greater than the width W1 of the scribe line 102. In some embodiments, the width W3 of the opening 402' is less than the width W2 of the opening 402.

In some embodiments, lower sidewalls 400B of the light-shielding layer 400 are generated due to the formation of the opening 402', thereby forming the light-shielding layer 400 having a stair-step sidewall. For example, the stair-step sidewall of the light-shielding layer 400 includes an upper sidewall 400A distal to the substrate 100 and a lower sidewall 400B adjacent to the substrate 100, as shown in FIG. 2D. In some embodiments, the minimum distance between the upper sidewall 400A of the light shielding layer 400 and the transparent pillars 300 is shorter than the minimum distance between the lower sidewall 400B of the light shielding layer 400 and the transparent pillars 300, as shown in FIG. 2D.

In some embodiments, the remaining sacrificial structure 302' can be removed by an etching process and an etchant similar to the etching process and the etchant for removing the remaining material of the light-shielding layer 400 as described above, and the details are not repeated herein. In some other embodiments, the remaining sacrificial structure 302' can be removed by a rinsing process, such as removed by deionized (DI) water.

Next, as shown in FIG. 2E, in some embodiments, a planarization process is performed to remove the top portion of the light shielding layer 400. As a result, the top surface of the light shielding layer 400 is leveled with the top surfaces of the transparent pillars 300. As mentioned above, the transparent pillars 300 on the sensing pixels 202 and the light-shielding layer 400 between the transparent pillars 300 together form a light collimating layer 600. In some embodiments, the light-shielding layer 400 in this exemplified embodiment FIG. 2D can be planarized in a planarization process similar to the process for planarizing the light-shielding layer 400 in FIG. 1E, and the details are not repeated herein.

As shown in FIG. 2F, another cutting process is performed to cut the substrate 100 along the scribe line 102, thereby forming the semiconductor device 20. Since the scribe line 102 is not covered by any structure (such as a light-shielding layer 400 or a sacrificial structure 302), the cutting process is only performed on the substrate 100 during the cutting process for obtaining individual dies from the wafer. That is, no structure or layer is cut during the cutting process, except for the substrate 100. Therefore, the risk of causing microcracks in the material layers and the risk of peeling due to poor adhesion between the substrate 100 and another structure or layer during the cutting process can be reduced. Accordingly, the delamination at the corners or edges of a die that typically happens in subsequent reliability tests can be eliminated.

In some embodiments, a substrate 100' is formed after the cutting process is performed on the substrate 100. The sidewall 400B of the light shielding layer 400 and an edge 100E of the substrate 100' together form a stepped profile, as shown in FIG. 2F. In some embodiments, the distance between the sidewall 400B of the light shielding layer 400 and the edge 100E of the substrate 100' is in a range of greater than about 1 μm and about 600 μm, such as about 90 μm. In some embodiments, the cutting process performed in this exemplified embodiment for forming the substrate 100' in FIG. 2F can be similar to the cutting process performed in the aforementioned embodiment for forming the substrate 100' in FIG. 1F, and the details are not repeated herein.

According to the aforementioned embodiment, an extra sacrificial structure can be formed directly above the scribe line before forming the light shielding layer, thereby shortening the time required for performing the etching process subsequently.

Figure 3A:
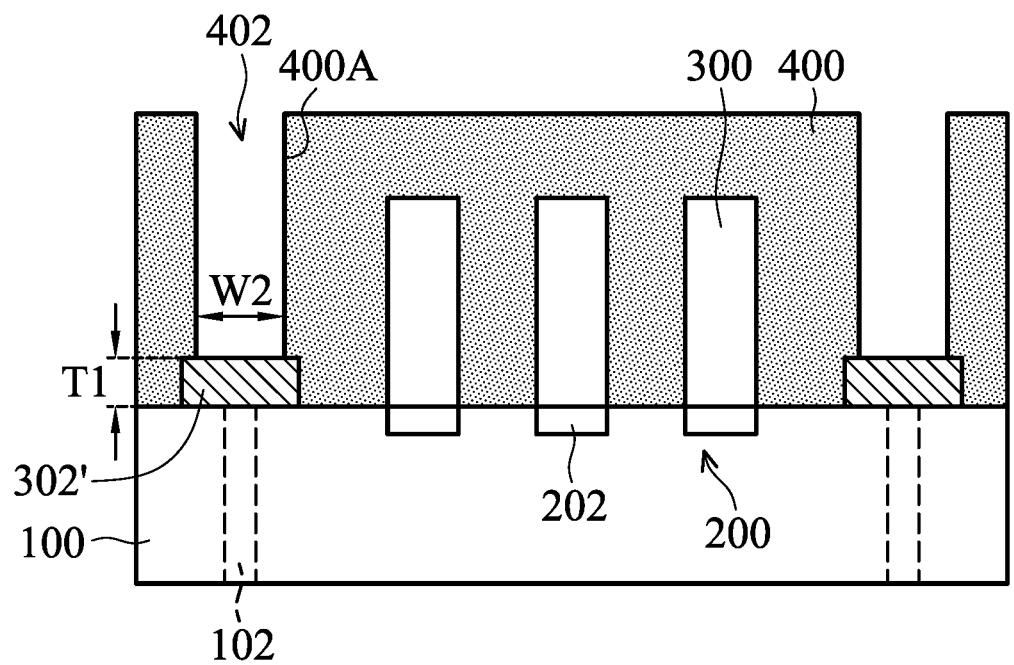
FIG. 3A to FIG. 3C are cross-sectional views illustrating intermediate stages of yet another exemplary method for forming the semiconductor device 30 of FIG. 3C in accordance with some embodiments.
Figure 3B:
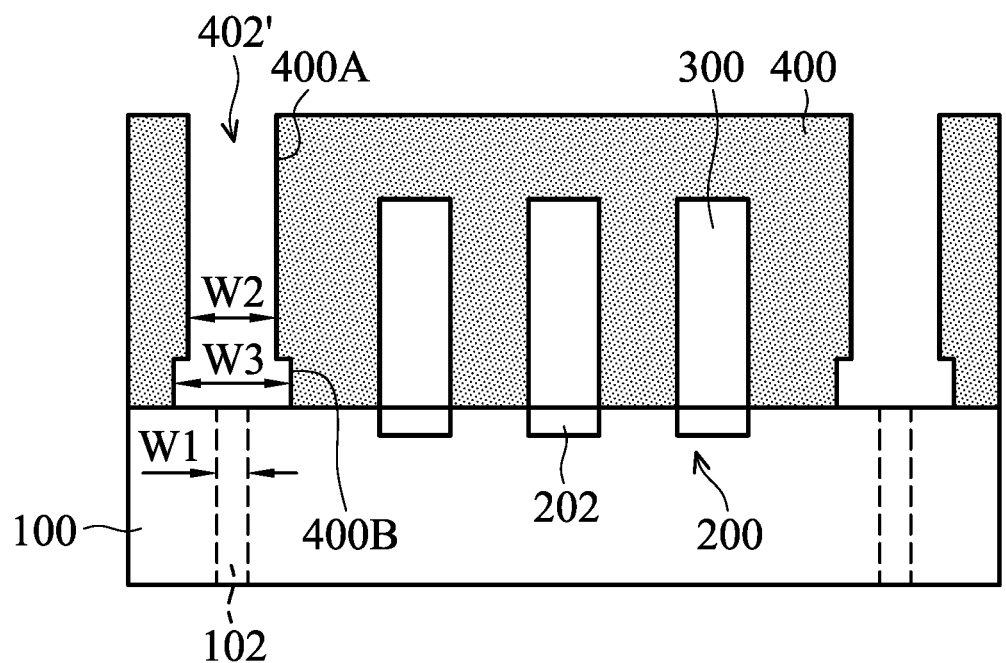
Figure 3C:
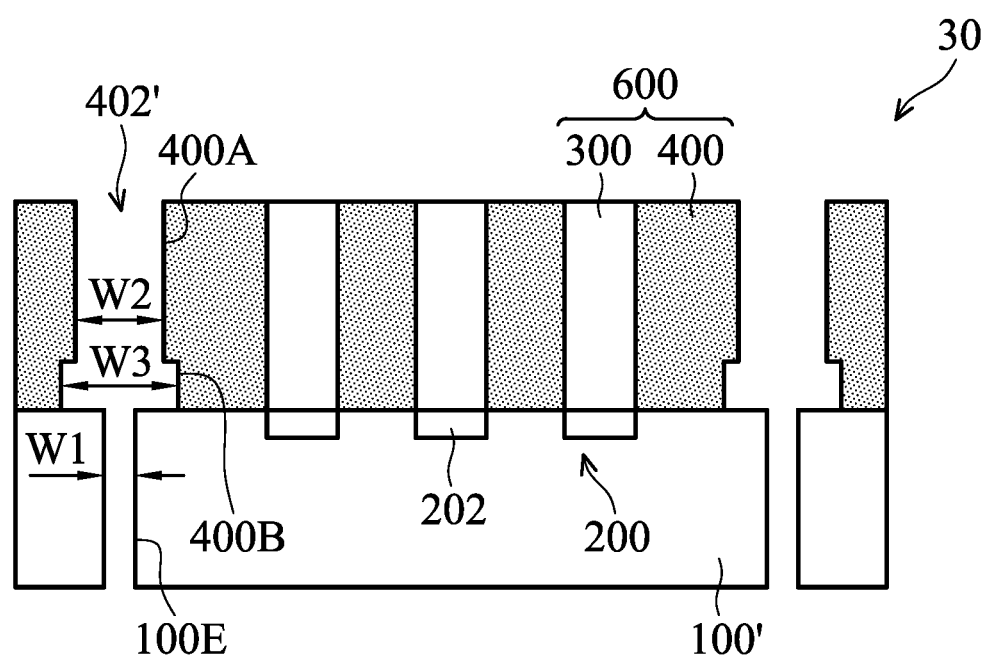

FIG. 3A to FIG. 3C are cross-sectional views illustrating intermediate stages of yet another exemplary method for forming the semiconductor device 30 of FIG. 3C in accordance with some embodiments. For the sake of clarity, elements and processes that are the same or similar will be given the same reference numbers. For the purpose of brevity, the descriptions of these processes and devices are not repeated herein.

Size of the sacrificial structure 302 can be adjusted to obtain the light shielding layer 400 having a desired profile. In this embodiment, the semiconductor device 30 is identical to the semiconductor device 20 except that the sidewall of the light-shielding layer 400 has an inverted-step profile.

In this embodiment, the processes as described in FIG. 2A to FIG. 2C can be performed, except that the width of the sacrificial structure 302 is greater than the width of the opening 402, to form a structure as shown in FIG. 3A. In this embodiment, the width of the sacrificial structure 302 is greater than the width W2 of the opening 402, so that the opening 402 merely exposes a portion of the top surface of the remaining sacrificial structure 302'.

Next, as shown in FIG. 3B, an etching process is performed along the opening 402 to remove the remaining sacrificial structure 302' above the scribe line 102 until the scribe line 102 is exposed. Thus, the opening 402 is extended to form an opening 402'. The remaining sacrificial structure 302' above the scribe line 102 can be completely removed by the etching process without damaging the surface of the substrate 100.

In some embodiments, the remaining sacrificial structure 302' can be removed by an etching process and an etchant similar to the etching process and the etchant for removing the remaining material of the light-shielding layer 400 as described above, and the details are not repeated herein. In some other embodiments, the remaining sacrificial structure 302' can be removed by a rinsing process, such as removed by deionized (DI) water.

In some embodiments that a dry etching process is selected as the etching process, the width W3 of the opening 402' is substantially equal to the width W2 of the opening 402 (not shown). In some other embodiments that a wet etching process is selected as the etching process, the width W3 of the opening 402' is substantially larger than the width W2 of the opening 402, as shown in FIG. 3B.

In some embodiments that the width W3 of the opening 402' is larger than the width W2 of the opening 402, a lower sidewall 400B of the light-shielding layer 400 is formed after forming the opening 402'. Thus, the sidewall of the light-shielding layer 400 has an inverted-step profile. The sidewall of the light-shielding layer 400 having an inverted-step profile includes the upper sidewall 400A distal to the substrate 100 and the lower sidewall 400B adjacent to the substrate 100, as shown in FIG. 3B. For example, the minimum distance between the upper sidewall 400A of the light shielding layer 400 and the transparent pillars 300 is greater than the minimum distance between the lower sidewall 400B of the light shielding layer 400 and the transparent pillars 300, as shown in FIG. 3B.

In some other embodiments, the width of the opening 402 can be changed by adjusting the parameters of the cutting process, thereby changing the profile of the sidewall of the light shielding layer 400. For example, without changing the size of the sacrificial structure 302 (i.e., the same as the size of the sacrificial structure 302 in FIG. 2A-FIG. 2C), a light shielding layer 400 having an inverted-step profile can be obtained by adjusting the parameters of the cutting process to form the width of the opening 402 greater than the width of the sacrificial structure 302.

Next, a planarization process and another cutting process similar to the planarization process and the cutting process described in FIG. 2E-FIG. 2F are performed to form the semiconductor device 30, as shown in FIG. 3C. In some embodiments, a substrate 100' is formed after the cutting process is performed on the substrate 100. Also, the sidewall 400B of the light shielding layer 400 and an edge 100E of the substrate 100' together form a stepped profile, as shown in FIG. 3C. In some embodiments, the distance between the sidewall 400B of the light shielding layer 400 and the edge 100E of the substrate 100' is in a range from greater than 0 µm to about 600 µm, such as in a range of about 1 µm to about 500 µm.

In the aforementioned embodiments, the size of the sacrificial structure can be adjusted to obtain the light shielding layer having a desired profile.

In summary, the embodiments of the present disclosure provide a method for forming a semiconductor device. In some embodiments, a cutting process and an etching process are performed to remove material above the scribe line until the scribe line is exposed. Most of the material above the scribe line can be quickly removed by the etching process, and the scribe line is covered by the remaining material. The remaining material protects the substrate from damage during the cutting process. Then, the remaining material is removed by the etching process. The etching process can effectively remove the remaining material without damaging the surface of the substrate 100. Therefore, during the cutting process for obtaining individual dies from the wafer, the risk of causing micro-cracks in the material layers and the risk of peeling due to poor adhesion between the substrate 100 and another structure or layer can be reduced. Accordingly, the delamination at the corners or edges of a die that typically happens in subsequent reliability tests can be eliminated. Thus, the reliability of the semiconductor device can be improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
    providing a substrate having a scribe line;
    forming a sensing pixel array in the substrate, wherein the sensing pixel array comprises a plurality of sensing pixels;
    forming a plurality of transparent pillars over the substrate, wherein each of the plurality of transparent pillars is correspondingly disposed on one of the plurality of sensing pixels of the sensing pixel array;
    forming a light shielding layer over the substrate and over the transparent pillars;
    performing a first cutting process to form an opening directly above the scribe line, and leaving a remaining material covering the scribe line; and
    performing an etching process along the opening to remove the remaining material until the scribe line is exposed.

2. The method as claimed in claim 1, wherein a thickness of the remaining material is in a range between about 5 µm and about 100 µm.

3. The method as claimed in claim 1, wherein the remaining material is the light shielding layer.

4. The method as claimed in claim 1, further comprising forming a sacrificial structure above the scribe line before forming the light shielding layer, wherein the remaining material is the sacrificial structure.

5. The method as claimed in claim 4, wherein the first cutting process further comprises removing a portion of the sacrificial structure.

6. The method as claimed in claim 1, wherein the scribe line has a first width, and the first width is in a range between about 25 µm and about 500 µm.

7. The method as claimed in claim 6, wherein a bottom of the opening has a second width after the first cutting process and before the etching process, wherein the second width is in a range between about 25 µm and about 600 µm.

8. The method as claimed in claim 7, wherein the bottom of the opening has a third width after the etching process, wherein the third width is in a range between about 25 µm and about 200 µm.

9. The method as claimed in claim 8, wherein the second width is greater than the first width, and the third width is greater than the first width.

10. The method as claimed in claim 8, wherein the second width is equal to the third width.

11. The method as claimed in claim 8, wherein the opening has a stair-step sidewall.

12. The method as claimed in claim 11, wherein the second width is greater than the third width.

13. The method as claimed in claim 11, wherein the second width is less than the third width.

14. The method as claimed in claim 4, wherein the sacrificial structure and the plurality of transparent pillars comprise the same material.

15. The method as claimed in claim 1, further comprising performing a second cutting process to cut the substrate along the scribe line.

* * * * *